US008667368B2

(12) United States Patent
Gupta et al.

(10) Patent No.: US 8,667,368 B2
(45) Date of Patent: Mar. 4, 2014

(54) METHOD AND APPARATUS FOR READING NAND FLASH MEMORY

(75) Inventors: Anil Gupta, Saratoga, CA (US); Oron Michael, San Jose, CA (US); Robin John Jigour, San Jose, CA (US)

(73) Assignee: Winbond Electronics Corporation, Taichung (TW)

( * ) Notice: Subject to any disclaimer, the term of this patent is extended or adjusted under 35 U.S.C. 154(b) by 109 days.

(21) Appl. No.: 13/464,535

(22) Filed: May 4, 2012

(65) Prior Publication Data
US 2013/0297987 A1 Nov. 7, 2013

(51) Int. Cl.
*G11C 29/00* (2006.01)
(52) U.S. Cl.
USPC ............. 714/763; 714/773; 714/752; 710/5; 365/185.12; 365/185.33; 711/103; 711/118; 711/143
(58) Field of Classification Search
None
See application file for complete search history.

(56) References Cited

U.S. PATENT DOCUMENTS

| 5,822,245 | A   | * | 10/1998 | Gupta et al. | 365/185.12 |
|-----------|-----|---|---------|--------------|------------|
| 6,775,184 | B1  |   | 8/2004  | Park et al.  |            |
| 7,558,900 | B2  |   | 7/2009  | Jigour et al.|            |
| 8,103,936 | B2  | * | 1/2012  | Pekny et al. | 714/763    |
| 2004/0153902 | A1 | * | 8/2004 | Machado et al. | 714/710 |
| 2005/0289314 | A1 | * | 12/2005 | Adusumilli et al. | 711/168 |
| 2013/0013817 | A1 | * | 1/2013 | Chen et al. | 710/5 |
| 2013/0080858 | A1 | * | 3/2013 | Lee et al. | 714/773 |

FOREIGN PATENT DOCUMENTS

| JP | 06-005085 | 1/1994 |
| JP | 08-045285 | 2/1996 |
| JP | 2001-184874 | 7/2001 |
| JP | 2001-202792 | 7/2001 |
| JP | 2003-249082 | 9/2003 |
| JP | 2010-146654 | 3/2010 |

OTHER PUBLICATIONS

Cooke, J., The Inconvenient Truths of NAND Flash Memory, Flash Memory Summit, Santa Clara, CA, Micron Technologies, Inc. Aug. 2007, 32 pages.
Cooke, J., On-die ECC NAND, Micron Technologies, Inc., slide 13, 2009, [online] [retrieved on Apr. 13, 2012]. Retrieved from the Internet<URL:http://extmedia.micron.com/webmedia/ondieecc/ondieecc.html>.
Elnec, NAND Flash Memories and Programming NAND Flash Memories Using ELNEC Device Programmers: Application Note, Version 2.10, Aug. 2008, 44 pages.
Micron Technology, Inc., Get More for Less in Your Embedded Designs with Serial NAND Flash, 2008, 2 pages.

(Continued)

*Primary Examiner* — John Trimmings
(74) *Attorney, Agent, or Firm* — David H. Carroll

(57) ABSTRACT

A page buffer for a NAND memory array has a data register and a cache register that are suitably organized and operated to eliminate gaps and discontinuities in the output data during a continuous page read. The cache register may be organized in two portions, and the page data in the cache may be output from the cache portions in alternation. ECC delay may be eliminated from the output by performing the ECC computation on one cache portion while the other is being output. The data register may also be organized in two portions corresponding to the cache portions, so that data may be transferred to one cache portion while the other is being output. In a variation, the continuous page read may be done without ECC.

18 Claims, 6 Drawing Sheets

(56) References Cited

OTHER PUBLICATIONS

Micron Technology, Inc., NAND Flash Memory, MT29F2G08AABWP, MT29F2G16AABWP, MT29F4G08BABWP, MT29F4G16BABWP, MT29F8G08FABWP, 2004, 57 pages.

Micron Technology, Inc., Technical Note TN-29-01: NAND Flash Performance Increase Using the Micron Page Read Cache Mode Command, 2004, 10 pages.

Micron Technology, Inc., Technical Note TN-29-19: NAND Flash 101: An Introduction to NAND Flash and How to Design it in to Your Next Product, 2006, 27 pages.

Micron Technology, Inc., Technical Note TN-29-25: Improving NAND Flash Performance Using Two-Plane Command Enabled Micron Devices MT29F4G08AAA, MT29F8G08BAA, MT29F8G08DAA, MT29F16G08FAA, MT29F8G08MAA, MT29F16G08QAA, and MT29F32G08TAA, 2007, 11 pages.

Nexflash Technologies, Inc., NX25F640C 64M-Bit Serial Flash Memory with 4-Pin SPI Interface, Nov. 2002, 24 pages.

Winbond Electronics Corporation, W25Q64DW spiflash 1.8V 64M-Bit Serial Flash Memory with Dual/Quad SPI and QPI, Preliminary Revision C, Jan. 13, 2011, 82 pages.

Japanese Patent Office. Office Action: Japanese Patent Application No. 2012-228058, Nov. 12, 2013. 3 Pages.

Japanese Patent Office. Office Action(Translation): Japanese Patent Application No. 2012-228058, Nov. 12, 2013. 2 Pages.

\* cited by examiner

METHOD AND APPARATUS FOR READING NAND FLASH MEMORY

BACKGROUND OF THE INVENTION

1. Field of the Invention

The present invention relates to flash memory, and more particularly to methods and apparatus for reading NAND flash memory.

2. Description of Related Art

NAND Flash memory has become increasingly popular due to its significant cost advantage. One measure of cost of Flash memory is memory cell area, wherein the memory cell area is commonly expressed in terms of F*2. The F, commonly called feature size, is usually the technology node. In other words, F is 58 nm for 58 nm technology node and F is 46 nm for 46 nm technology node. The NAND Flash memory cell size of 4F*2 is significantly smaller than other competing technologies such as NOR Flash memory, which has a cell size in the range of about 12F*2 through 15F*2.

Another segment of Flash memory with good growth has been the Serial Peripheral Interface ("SPI") segment. One reason for the popularity of serial NOR Flash memory with SPI is low pin count (e.g. pins CS/, CLK, DI, DO for single-bit SPI). The availability of serial NOR Flash with SPI in small and inexpensive packages such as the 8-pin package enables significant board space savings. Moreover, the serial NOR Flash products with SPI have been designed on NOR Flash technology to accommodate applications requiring fast data fetch from random address. The NOR Flash inherently provides fast random read speed due to larger cell current. In contrast, NAND Flash has large initial latency and therefore NAND Flash is better suited for applications with sequential access of data, including but not limited to code shadowing. The slow random read speed of NAND Flash is due to very small cell current inherent in NAND Flash, due to multiple cells (e.g. 32 cells) connected in series in a NAND string.

As scaling of NOR Flash technology has slowed down, serial NAND Flash products with SPI have become available because of the memory cell area advantage. FIG. 1 illustrates a NAND memory array 19 and associated page buffer 10 in a single-plane architecture. The page buffer 10 has two registers, a data register ("DR") 16 and a cache register ("CR") 14. The use of the cache register 14 along with the data register 16 allows for cache operation, which achieves increased read thru-put in the following manner.

On the issuance of a page read ("PR") command, Page-0 data is transferred from the specified page, shown as page 18, to the data register 16, typically in about 20 µs. While successive PR commands may be used to read sequential pages from memory, each page read incurs a 20 µs delay. These successive 20 µs delays may be masked by using the page read cache mode ("PRCM") command. ON the issuance of a PRCM command after the PR command, the Page-0 data in the data register 16 is very quickly transferred to the cache register 14, typically in a maximum time of 3 µs, from which it is read out to a data bus 11. Issuance of the PRCM command also starts a transfer of Page-1 data from the next sequential page (not shown) to the data register 16, simultaneously with the output of the Page-0 data from the cache register 14. After Page-0 data has been read out from the cache register 14, another PRCM command may be issued. This second PRCM command transfers Page-1 data from the data register 16 to the cache register 14 in typically a maximum time of 3 µs, from which the Page-1 data is read out onto the data bus 11. The second PRCM command also transfers the Page-2 data from the next sequential page (not shown) to the data register 16, simultaneously with the output of the Page-1 data from the cache register 14. In this manner, sequential pages are read out by issuing multiple PRCM commands. Although gaps of up to 3 µs are present between data read from successive pages, throughput is nonetheless greatly improved by cache read operation.

Unfortunately, cache read operation conflicts with on-chip implementations of Error Correction Code ("ECC"). ECC is commonly used in NAND Flash because the inherent cycling (endurance) of NAND Flash is not as good as that of NOR Flash. ECC may be performed on-chip or externally by a host controller. External ECC by a host controller is quite effective for masking random single (or few) bit error(s) in the NAND Flash. The number of bits which can be corrected depends on the choice of ECC algorithm (e.g. Hamming, BCH, Reed-Solomon, or another appropriate ECC algorithm) used by the host controller. However, external ECC provided by a host controller is a burden on the host. Some recent NAND Flash devices include ECC on the NAND Flash chip itself, referred from herein as "on-chip ECC." The on-chip ECC performs ECC computation and provides the correction of wrong bit(s). However, in those implementations of NAND Flash memory which use the cache register for the ECC computation, read-out of page data from the cache register cannot be done while ECC computations are in process. While such ECC NAND Flash memory devices may be read using the standard PR command, a long wait is incurred which includes the time to transfer page data to the page buffer and the time for ECC to be performed. While ECC computation time varies depending on the algorithm and implementation, a 20 µs computation time is not uncommon. In such a case, every PR command, even for sequential pages, incurs a wait time of about 40 µs, specifically 20 µs for page data transfer to the page buffer and 20 µs for the ECC computation, before page data can be read out. This delay is a significant penalty in read thru-put due to on-chip ECC.

BRIEF SUMMARY OF THE INVENTION

One embodiment of the present invention is a method for outputting a plurality of pages of data from a NAND memory array to a data bus through a data register and a cache register associated with the NAND memory array, comprising storing NAND memory array data in the data register, the data register being organized in a plurality of portions, and the cache register being organized in a plurality of portions corresponding to the portions of the data register; outputting data from the cache register portions, seamlessly and in alternation; while outputting data from a first one of the cache register portions, providing data to one of the cache register portions other than the first portion from the corresponding portion of the data register and performing an ECC computation thereon; and while outputting data from a second one of the cache register portions, providing data to one of the cache register portions other than the second portion from the corresponding portion of the data register and performing an ECC computation thereon.

Another embodiment of the present invention is a method for providing a continuous data output from a NAND memory array to a data bus through a page buffer, the page buffer having a data register and a cache register, comprising: storing NAND memory array data in the data register; transferring a first portion of data from a first portion of the data register to a first portion of the cache register; subsequent to the first data portion transferring step, performing a first ECC computation on data in the first cache register portion; subsequent to the first ECC computation performing step, outputting data from the first cache register portion to the data bus; transferring a second portion of data from a second portion of the data register to a second portion of the cache register; subsequent to the second data portion transferring step, performing a second ECC computation on data in the second cache register portion; and subsequent to the second ECC computation performing step, outputting data from the second cache register portion to the data bus. The first cache register portion outputting step and the second cache register portion outputting step are performed continuously and in alternation; the first ECC computation performing step is performed during the second cache register portion outputting step; and the second ECC computation performing step is performed during the first cache register portion outputting step.

Another embodiment of the present invention is a flash memory comprising: a NAND flash memory array having word lines and bit lines; a row decoder coupled to the NAND flash memory array; a data register coupled to the NAND flash memory array; a cache register coupled to the data register; an ECC circuit coupled to the cache register; a column decoder coupled to the cache register; and a control circuit coupled to the row decoder, the column decoder, the data register, the cache register, and the ECC circuit. The cache register is organized in a plurality of portions, and the data register is organized in a plurality of portions respectively corresponding to the cache register portions. The control circuit comprises logic and memory elements for executing the functions of: reading data from the NAND flash memory array to the data register; transferring data from the data register portions to the respective cache register portions, in alternation; performing error correction with the ECC circuit on data in the cache register portions in alternation, to provide ECC processed data in the cache register portions; and outputting the ECC processed data from the cache register portions to the control circuit, seamlessly and in alternation; wherein execution of the data transferring function and the ECC processed data outputting function for a particular one of the cache register portions is adapted for different times; and wherein execution of the error correction performing function and the ECC processed data outputting function for a particular one of the cache register portions is adapted for different times.

Another embodiment of the present invention is a NAND flash memory comprising: a NAND flash memory array; a row decoder coupled to the NAND flash memory array; a one page data register coupled to the NAND flash memory array; a page of transmission gates; a one page cache register coupled to the data register through the transmission gates; a column decoder coupled to the cache register; and a control circuit coupled to the row decoder, the column decoder, the data register, the cache register, and the transmission gates. A first group of the transmission gates, and a second group of the transmission gates distinct from the first group, are separately and independently controllable. In a variation, the NAND flash memory further comprises an ECC circuit coupled to the cache register.

DETAILED DESCRIPTION OF THE INVENTION, INCLUDING THE BEST MODE

Page buffer for a NAND memory array is suitably organized and operated to eliminate gaps and discontinuities in the output data during a continuous page read after the initial page read. The page buffer includes a data register for receiving page data transferred from the NAND memory array, and a cache register for receiving page data transferred from the data register, thereby freeing up the data register to receive a subsequent page of data from the NAND memory array without causing any gaps or discontinuities in the data output from the cache register. As used herein, the term "transfer" refers to transmission of data from a source to a destination, and does not concern the disposition of the data at the source, which data may be remain undisturbed, deleted, refreshed, rewritten, modified, or otherwise treated. The cache register may be organized in two or more portions, and the page data in the cache register may be output continuously from the cache portions in alternation. In a two-portion implementation, for example, portion A may be output, then B, then A, then B, and so forth. In a three-portion implementation, for example, A may be output, then B, then C, then A, then B, then C, and so forth. ECC computation delay may be eliminated from the output by performing the ECC computation on one cache portion while another is being output. The data register may also be organized in two or more portions corresponding to the cache portions. Page data transfer delay from the data register to the cache register may be eliminated from the output by transferring the page data between the data register portions and the cache register portions in alternation, so that one page data portion is being transferred while another page portion is being output. In this manner, a continuous page read may be performed with ECC and without any gaps or discontinuities in the output between respective portions of the page data or between the page data across pages and blocks.

While performing ECC on-chip in a NAND memory device without any gaps or discontinuities in the output during a continuous page read is particularly advantageous, other variations may be useful as well. In one such variation, on-chip ECC is not done but the organization of the data register and the cache register respectively in two or more portions is retained so that a continuous page read may be performed without any gaps or discontinuities in the output.

Figure 1:
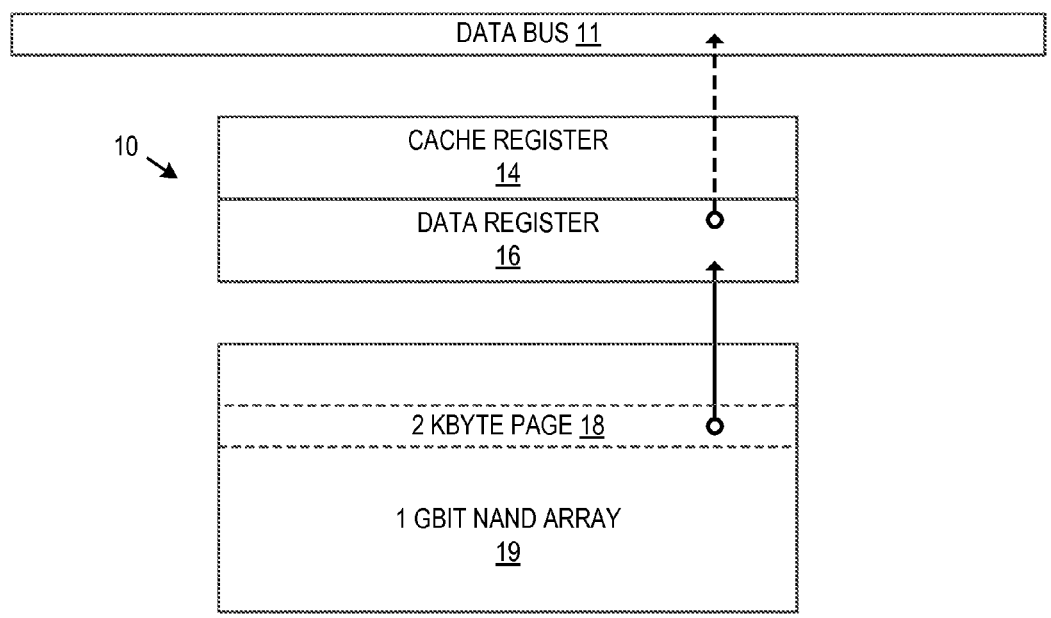
FIG. 1 is a schematic functional block diagram of an illustrative implementation of a NAND memory array and page buffer of the prior art.
Figure 2:
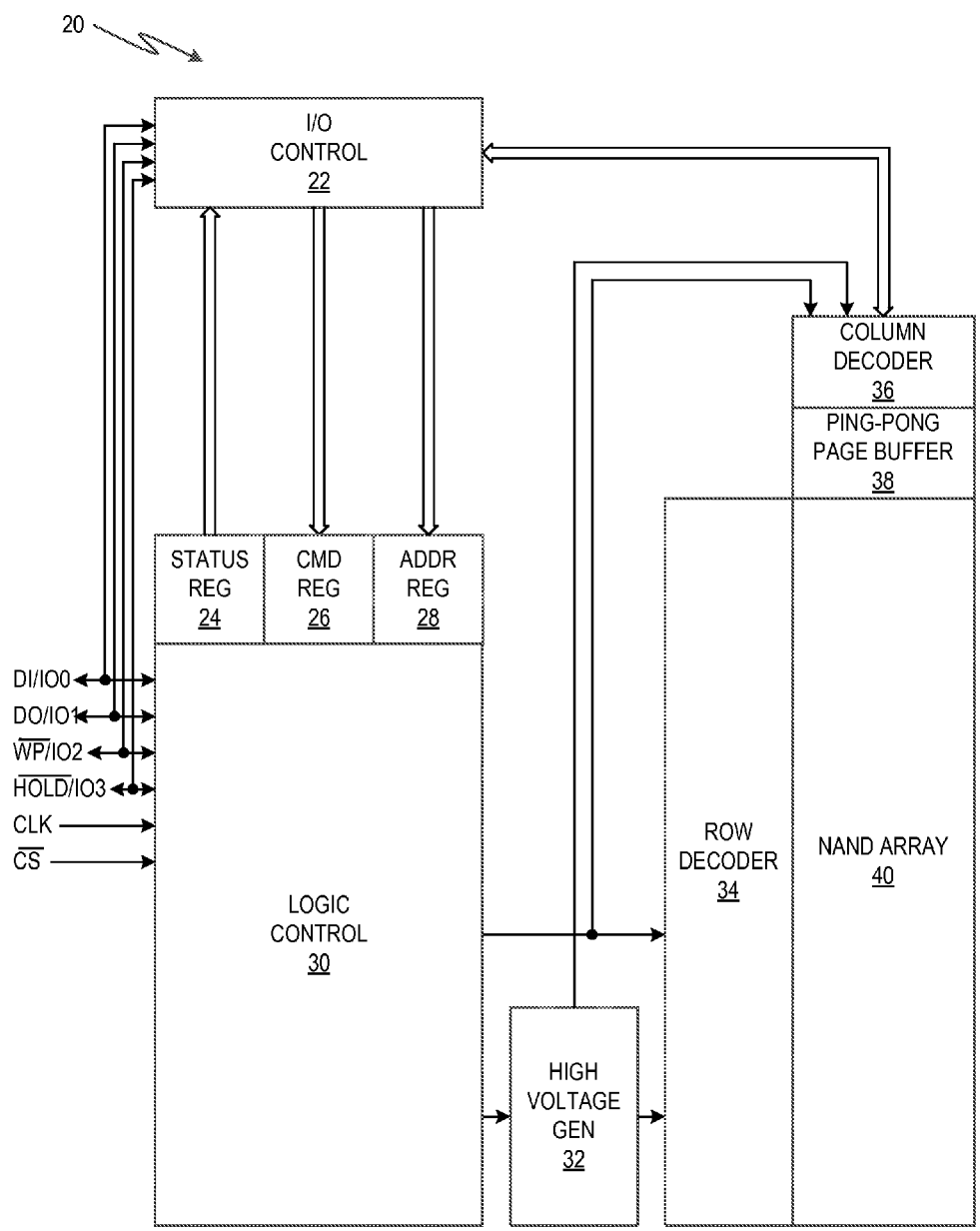
FIG. 2 is a schematic functional block diagram of a NAND memory device.

FIG. 2 is a schematic functional block diagram of a NAND memory device 20 which includes a NAND array 40 and associated page buffer 38. The NAND array 40 includes word (row) lines and bit (column) lines, and any desired NAND technology may be used for the memory cells of the NAND array 40. The page buffer 38 includes a one-page data register, a one-page cache register, and one page of transmission gates for copying data from the data register to the cache register. Any suitable latch or memory technology may be used for the data register and the cache register; illustratively a latch may be implemented as back-to-back connected inverters. Any suitable gating technology may be used for the transmission gates; illustratively a transmission gate may be implemented as a CMOS transmission gate. The data register and the cache register may be organized in any desired number of respect portions by, for example, the manner in which the transmission gates are wired and operated to control transmission of data. Illustratively, the data register and the cache register may be organized in respective portions and operated in alternation by using respective groups of transmission gates controlled by respective control lines. The data register and the cache register of the page buffer 38 may be operated in a conventional manner by applying the same control signal to both transmission gate control lines, or may be operated in alternation by applying suitable timed control signals to the transmission gate control lines. Illustratively in a two portion implementation in which a page is 2K Bytes, a half-page (1K) of transmission gates may be controlled by one control line and the other half-page (1K) of transmission gates may be controlled by another control line, thereby organizing the data register and the cache register in two half-page (1K) portions. Because of the operation of two portions in alternation, a two-portion implementation of the page buffer 38 may be referred to as a "ping pong" buffer. This manner of organizing the data register and cache register into portions is illustrative, and other techniques may be used if desired.

As also shown in FIG. 2, the NAND memory device 20 may include various other circuits to support memory programming, erase and read, such as row decoder 34, column decoder 36, I/O control 22, status register(s) 24, command register 26, address register 28, logic control 30, and high voltage generators 32. While the NAND memory device 20 may be packaged in any desired manner and may have any type of interface, including conventional NAND memory device interfaces, the logic control 30 illustratively implements the SPI and QPI protocols, including the multi-IO SPI interface. Additional detail on QPI and the SPI interface and on the circuits related to the memory arrays may be found in U.S. Pat. No. 7,558,900 issued Jul. 7, 2009 to Jigour et al., and in a publication by Winbond Electronics Corporation, W25Q64DW: SpiFlash 1.8V 64M-Bit Serial Flash Memory with Dual/Quad SPI & QPI: Preliminary Revision C, Hsinchu, Taiwan, R.O.C., Jan. 13, 2011, which hereby are incorporated herein in their entirety by reference thereto.

While the NAND memory device 20 is organized and operated to perform a continuous read operation and on-chip ECC in a single-plane NAND Architecture, this architecture is illustrative and variations thereof are contemplated. While the example of a 2 KB Page size is used throughout this document, it will be appreciated that the page and block sizes are illustrative and may be different if desired. The page in a NAND Flash specifies the granularity for programming (e.g. 2K Bytes), and the block in NAND flash specifies granularity for erasing (e.g. 128K Bytes). The page also specifies granularity for reading data in standard NAND Flash. Moreover, the specific size reference is not to be taken literally, since the actual page size may vary depending on design factors; for example, the term may include a 2,048 Byte main area plus an additional 64 Byte spare area, where the spare area is used for storing ECC and other information such as the user metadata. In the same way, the term 1 KB may refer to a 1,024 Byte main area and a 32 Byte spare area. While the description herein is based upon a single-plane architecture for clarity, the teachings set forth herein are equally applicable to multi-plane architectures. A plane is the smallest unit that serves an I/O request in a parallel fashion. When multiple physical planes are used, they may share one or more word-lines so that the memory system may service multiple I/O requests simultaneously. Each plane provides a page of data and includes a corresponding data register of one page size and a corresponding cache register of one page size. The techniques described herein may be applied to each plane separately such that each data register and cache register is organized in multiple portions, or may be applied to multiple planes such that each data register and cache register is itself one portion of a multiple page data register and cache register.

While a continuous read command may be expressed in different ways, the term generally refers to a type of command whose purpose is for reading through the whole or a desired portion of the memory array. In the case of the serial NAND Flash device with SPI 20 shown in FIG. 2, for example, the device 20 may be enabled by a CS/high to low transition, followed by the issuance of a continuous read command which includes a start address during appropriate clock cycles. After an assigned number of dummy clock cycles, the data is read out from the serial NAND Flash device with SPI 20. The data may be read across page and block boundaries without any gap or discontinuity, with the address automatically incrementing by an on-chip address counter (not shown).

FIG. 2 shows control signals CS/, CLK, DI, DO, WP/, HOLD/ which are for the SPI interface. The standard SPI Flash interface provides CS/ (chip select—complement), CLK (clock), DI (serial data-in), and DO (serial data-out) signals, along with optional signals WP/ (write protect—complement) and HOLD/ (hold—complement). The significance of complement signal is only reversal of polarity, e.g. CS/ low state enables the SPI Flash chip. While the 1-bit serial data bus (data-in through DI and data-out through DO) in the standard SPI interface provides a simple interface, it is limited in achieving higher read thru-put. A multi-bit SPI interface therefore evolved to additionally support dual (2-bit interface) and/or quad (4-bit interface) for increased read thru-put. FIG. 2 also shows additional data bus signals for Dual SPI and Quad SPI operation, i.e. I/O(0), I/O(1), I/O(2), and I/O(3), by selectively redefining the function of four pins. In the Quad SPI read operation, the appropriate read command may be given with 1-bit standard SPI interface through I/O(0), but subsequent interface for address and data-out is Quad based (i.e. 4-bit data bus). In another version of Quad SPI, both read command and address may be given with 1-bit standard SPI interface through I/O(0), but subsequent interface for data-out is Quad based (i.e. 4-bit data bus). Optional dummy clock cycles may be used between providing address and reading out data. The Quad SPI read operation can output 4-bits of data in a clock cycle as compared to output 1-bit of data in standard SPI read operation, and therefore the Quad SPI read operation can provide four times higher read thru-put. While Quad SPI read operation is used herein for explanation, the teachings herein are equally applicable to the other modes of operation, including but not limited to standard SPI, Dual SPI, Quad Peripheral Interface ("QPI") and Double Transfer Rate ("DTR") read modes. In the QPI protocol, the complete interface (command, address, and data-out) is done on 4-bit basis. In the DTR protocol, the output data is provided on both low-going and high-going CLK edge, rather than providing output data only on low-going CLK edge as in Single Transfer Rate ("STR") read mode operation.

FIGS. 3-6 show a data bus 51 and a NAND array 62, together with an illustrative implementation of a page buffer 50. The page buffer 50 includes a data register that is organized in two portions 56 and 57, which may be referred to as data register-0 ("DR-0") and data register-1 ("DR-1"). The page buffer 50 also includes a cache register that is organized in two portions 54 and 55, which may be referred to as cache register-0 ("CR-0") and cache register-1 ("CR-1"). Therefore, the page buffer 50 may be thought of as having a first portion which includes CR-0 54 and DR-0 56, and a second portion which includes CR-1 55 and DR-1 57. In an illustrative example, the page buffer may have a capacity of 4K Bytes, divided into two equal portions of 2K Byte capacity each. As such, the storage capacity for each of DR-0 56, DR-1 57, CR-0 54, and CR-1 55 is 1K Byte. DR may be used to refer to a full 2K Byte data register (i.e. DR-0 56 plus DR-1 57) and CR may be used to refer to a full 2K Byte cache register (CR-0 54 plus CR-1 55). A different size of page buffer may be used and/or a division of the page buffer into two unequal portions may be done if desired. Two sets of control signals may be needed for two portions of the page buffer 50, unlike one set of control signals needed for an undivided page buffer. Furthermore differences between the logical and physical NAND array does not affect teachings herein. For example, the physical array may have two pages (even 2 KB page and odd 2 KB page) on one word line, so that a word line may be 4 KB of NAND bit cells. For clarity, the description and drawings herein are based upon the logical NAND array. Furthermore, while the page buffer 50 is organized into 2 portions to support a continuous read operation, the change is transparent to the user. The program operation may be done for standard page size of 2 KB, and standard read operation, e.g. command to read the page data from cache after completing a page read operation, may be also done for standard page size of 2 KB. As such the internal organization of the page buffer 50 into two portions is primarily for the continuous read operation, and even then is such that its internal division is transparent to the user.

FIGS. 3-6 also illustratively show error correction circuit 52 ("ECC-0") which provides error correction of the contents of the cache register portion 54, and error correction circuit 53 ("ECC-1") which provides error correction of the contents of the cache register portion 55. The error correction circuits 52 and 53 may be based on any desired type of error correction algorithm.

Figure 6:
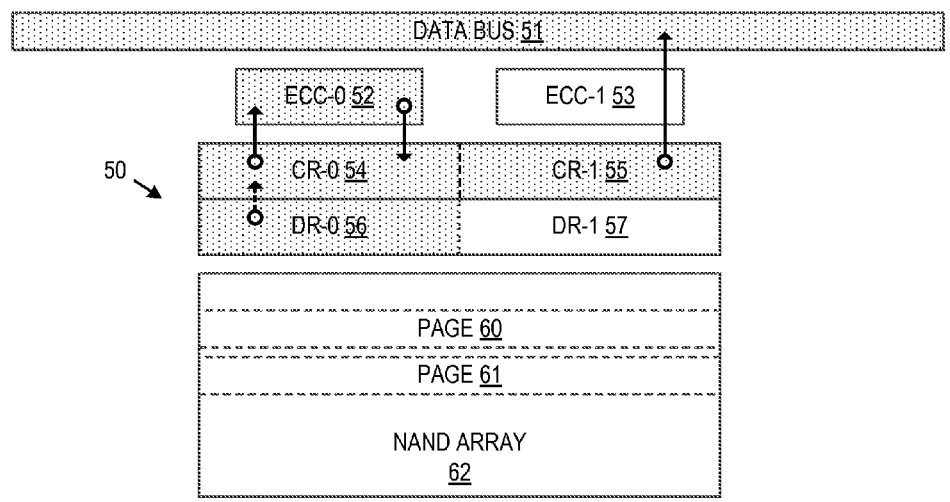
FIG. 6 is a schematic functional block diagram of the NAND memory array and page buffer implementation of FIG. 3 in yet another operating condition.
Figure 7:
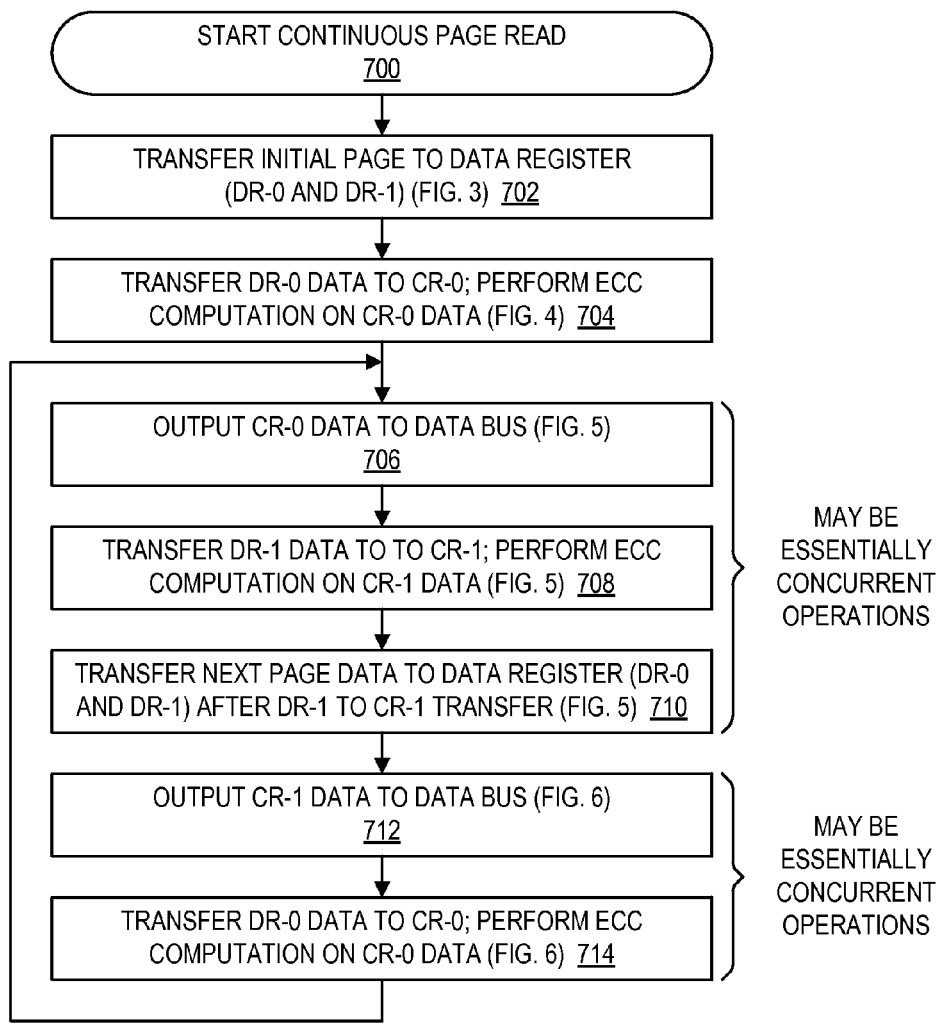
FIG. 7 is a flowchart showing a continuous page read operation with ECC.

FIG. 7 shows a flowchart for operating the page buffer 50 to achieve a continuous page read operation with ECC. The various blocks shown in FIG. 7 correlate with various successive operations shown in FIGS. 3-6. The time durations specified for various operations shown in FIGS. 3-6 is illustrative, and different time durations may be used depending on various design choices.

Figure 3:
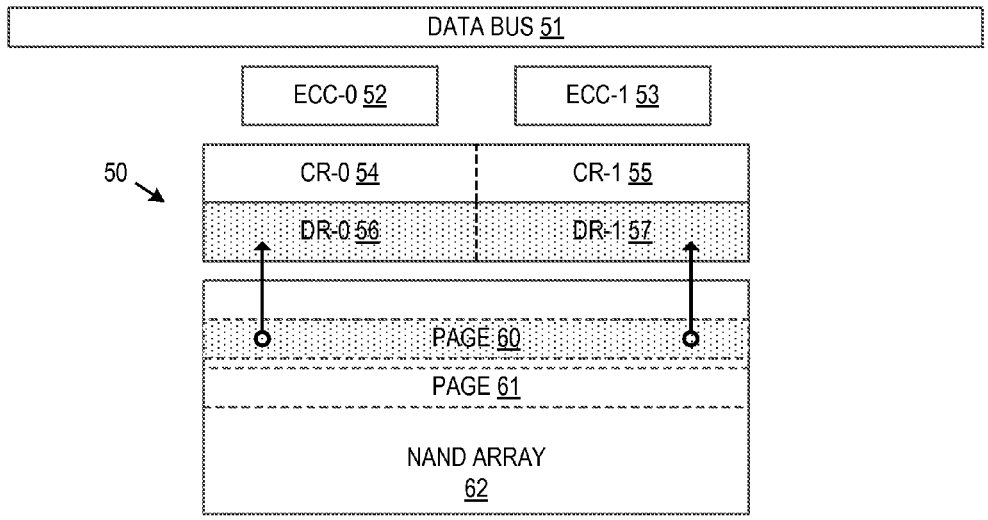
FIG. 3 is a schematic functional block diagram of an implementation of a NAND memory array and page buffer in a particular operating condition.

As shown in FIG. 3, the initial page 60 (Page-0) which is specified in the continuous page read command is transferred from the NAND array 62 to DR-0 and DR-1, the data register portions 56 and 57 (block 702). The functional blocks involved in this transfer are shaded with dots for clarity. Illustratively, 2 KB of data is transferred from page 60, which is Page-0 of the sequence, into DR-0 and DR-1. Illustratively, the transfer may proceed in one 2 KB transfer, although control of the read transmission gates may be suitably modified so that the read may be done in 1 KB each transfers into DR-0 and DR-1, which may or may not be simultaneous. The time for a page read operation (i.e. time to transfer page data from a NAND array to a data register) is illustratively 20 µs, although the exact time may vary depending on such design factors as the sensing circuit, type of cell (single-level cell or multi-level cell), and the technology node (such as 50 nm or 35 nm).

Figure 4:
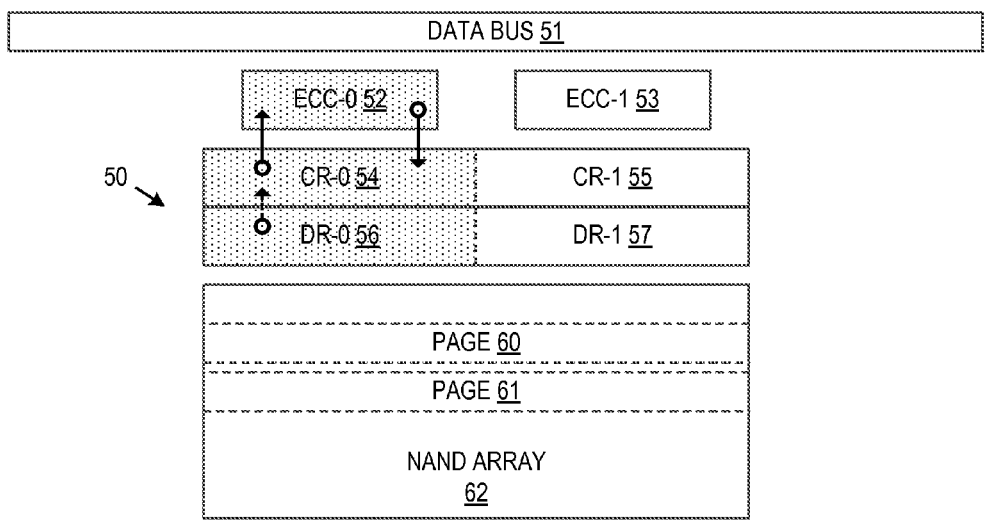
FIG. 4 is a schematic functional block diagram of the NAND memory array and page buffer implementation of FIG. 3 in another operating condition.

Next as shown in FIG. 4, a portion of the page data is transferred from data register portion 56 (DR-0) to the cache register portion 54 (CR-0), and an ECC computation is performed on the page data portion in the cache register portion 54 (CR-0) (block 704). The time for the transfer from DR-0 to CR-0 varies depending on design choices, but typically ranges from about 1 µs to about 3 µs. The time required for the error correction circuit 52 (ECC-0) to complete depends on the choice of ECC algorithm, the internal data bus, the on-chip timing oscillator period, and other design factors. Illustratively, the error correction circuit 52 may complete in about 12 µs. However, assuming the time budget for FIG. 4 to be 20 µs and the time for the DR-0 to CR0 transfer to be 2 µs, the error correction circuits 52 and 53 may be designed to complete in 18 µs or less.

In case of ECC error detected by ECC computation, the ECC-0 block may overwrite wrong data in CR-0 with corrected data during the ECC computation. In some cases, error information detected by the ECC computation may be stored in ECC-0 during the ECC computation and wrong data in CR-0 may not be overwritten with corrected data during the ECC computation. Alternatively, error information detected by the ECC computation may be stored in ECC-0 during the ECC computation, and wrong data in CR-0 may also be overwritten with corrected data during the ECC computation. The error information stored in ECC-0 may include the address of the wrong data, and both wrong data as well as expected (correct) data. Various ECC algorithms are suitable for use, including, for example, Hamming ECC algorithm, BCH ECC algorithm, Reed-Solomon ECC algorithm, and others. While two different ECC blocks ECC-0 and ECC-1 are shown in FIGS. 3-6 for clarity of explanation for respectively interfacing with CR-0 and CR-1, a single ECC block may be used to interface with both CR-0 and CR-1. Using a single ECC block may be advantageous in certain design because of die size saving. On the other hand, if the gate count for the ECC circuit is small, for example on the order of a few hundred gates, so that the area for the ECC block is small (e.g. from about 0.1 mm² to about 0.2 mm²), the use of two different ECC blocks (e.g. ECC-0 and ECC-1) may be a suitable design choice.

Figure 5:
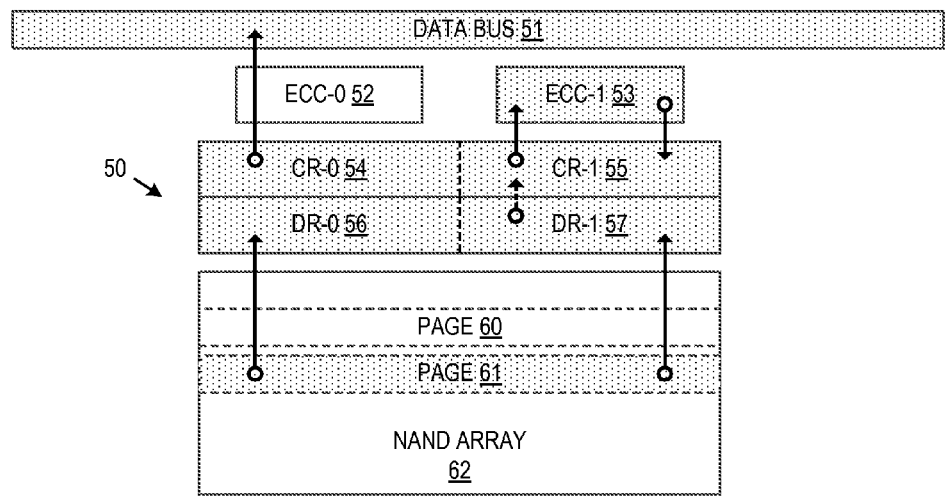
FIG. 5 is a schematic functional block diagram of the NAND memory array and page buffer implementation of FIG. 3 in yet another operating condition.

Next as shown in FIG. 5, various essentially concurrent operations may occur. In one such operation (FIG. 7, block 706), the Page-0 data in the cache register portion 54 (CR-0), which has already gone through the ECC computation, is sent to output through the data bus 51. While the path from the data bus 51 to an output port is not shown in FIG. 5, such paths are well known to a person of ordinary skill in the art. The operations shown in FIG. 3 and FIG. 4 may be considered initial latency, since the data is not ready for sending to output until ECC computation shown in FIG. 4 has been completed. But the data in CR-0 is ready for sending to output in FIG. 5, since data in CR-0 has already completed ECC computation. In the case of a Quad SPI continuous read operation, for example, 4-bits of data out may be sent in every clock cycle. The 4-bits data width is sometimes also referred to as nibble. Assuming a clock frequency of 100 MHz, the CR-0 data (1 KB) may be sent out in about 20 µs (Equation (1)), which is consistent with the 20 µs assumed for the operations of FIG. 5.

$$\text{Time to read out CR-0(1KB): 1KB} \times 8\text{-bit}/B \times 1\text{-nibble}/4\text{-bit} \times 1/100\text{MHZ} = 20\mu s \quad (1)$$

While 20 μs for each step simplifies illustration, more realistic time to read out CR-0 is calculated as 19.69 us based upon a 104 MHz clock and CR-0 data of 1024B, in accordance with Equation (2). However, the figure of 20 μs a reasonable approximation.

$$\text{Time to read CR-0(1024B): } 1024B \times 8\text{-bit}/B \times 1\text{-nibble}/4\text{-bit} \times 1/104MHZ = 19.69\mu s \quad (2)$$

Although the output shown in FIG. 5 sent out from the cache register portion 54 is the first output after initial latency, data continues to be sent out from CR-0 and CR-1 in successive ping-pong manner as may be seen by comparing FIG. 5 and FIG. 6, without any gaps or discontinuities in sending out data. In other words, four bits of data is sent out in every clock cycle of a Quad SPI continuous read operation after initial latency, until the user stops issuing clock when the desired amount of data has been received by the user. The data read out may for each page include not only the 2048 Bytes of the main page area, but also the 64 Bytes of spare area.

As further shown in FIG. 5, another of the essentially concurrent operations involves transferring the portion of page data in the data register portion 57 (DR-1) to the cache register portion 55 (CR-1), and performing an ECC computation on the page data portion in the cache register portion 55 (CR-1) (FIG. 7, block 708). The time for the transfer from DR-1 to CR-1 varies depending on design choices, but typically ranges from about 1 μs to about 3 μs. The time required for the error correction circuit 53 (ECC-1) to complete depends on the choice of ECC algorithm, the internal data bus, the on-chip timing oscillator period, and other design factors. Illustratively, the error correction circuit 52 may complete in about 12 μs. However, assuming the time for CR-0 data to be sent out to be 20 μs and the time for the DR-1 to CR-1 transfer to be 2 μs, the error correction circuits 52 and 53 may be designed to complete in 18 μs or less.

As further shown in FIG. 5, another of the essentially concurrent operations involves transferring the next sequential 2 KB page of data 61 (Page-1) from the NAND array 62 to the data register portions 56 and 57 (DR-0 and DR-1) (FIG. 7, block 710). While much of this transfer is concurrent with the operations shown in block 708, it begins after the DR-1 to CR-1 transfer. Illustratively, the transfer may proceed in one 2 KB transfer, although control of the read transmission gates may be suitably modified so that the read may be done in 1 KB each transfers into DR-0 and DR-1, which may or may not be simultaneous. The time for a page read operation is illustratively 20 μs, although the exact time may vary depending on such design factors as the sensing circuit, type of cell, and the technology node.

While FIG. 5 shows various operations proceeding essentially concurrently, not all operations need to proceed concurrently provided that gaps and other discontinuities in the output data are avoided in accordance with the teachings set forth herein.

Next as shown in FIG. 6, various essentially concurrent operations may occur. In one such operation (FIG. 7, block 712), the Page-0 data in the cache register portion 55 (CR-1), which has already gone through the ECC computation, is sent to output through the data bus 51. Assuming a clock frequency of 100 MHz, the CR-1 data (1 KB) may be sent out in about 20 μs.

As further shown in FIG. 6, another of the essentially concurrent operations involves transferring the portion of page data in the data register portion 56 (DR-0) to the cache register portion 54 (CR-0), and performing an ECC computation on the page data portion in the cache register portion 54 (CR-0) (FIG. 7, block 714). These operations proceed essentially as described in the text associated with FIG. 4.

While FIG. 6 shows various operations proceeding essentially concurrently so as to eliminate gaps and other discontinuities, such operations need not proceed concurrently if the timings of the operations is prohibitive and some discontinuity in the output is acceptable.

The continuous page read operation continues by looping back to block 706, and may be stopped by stopping the clock. Alternatively, the continuous page read command may be varied to stop after a predetermined number of page reads or in any other manner desired by the designer.

Advantageously, the continuous page read command may be a single command which causes reading through the whole or a desired portion of the NAND memory array with no gap or other discontinuity at page or block boundaries. This is achieved by reading data out in a "ping-pong" manner, i.e. reading from CR-0 and CR-1 in alternation. Essentially the operations shown in FIG. 5 and FIG. 6 are repeated until the whole or desired portion of the NAND memory array has been read. After the initial latency, 1 KB data from CR-0 is sent to output, then 1 KB data from CR-1 is sent to output in a seamless manner, then 1 KB data from CR-0 is sent to output in a seamless manner, then 1 KB data from CR-1 sent to output in a seamless manner, and so forth in this ping-pong manner until the user has received the desired data and stops the clock.

The page address is incremented automatically by an address counter in the NAND Flash memory device. The operations shown in FIG. 3 and FIG. 4 constitute initial latency, which consistent with the other timing described, may be about 40 μs. After the initial latency, 4-bits of data is sent out during each clock cycle in the example of a Quad SPI read, until the user stops the clock. The ping-pong operation takes place between the first page buffer portion and the second page buffer portion, with the first page buffer portion sending data to output while an ECC computation is being performed on the second page buffer portion, and the second page buffer portion sending data to output while an ECC computation is being performed on the first page buffer portion.

Figure 8:
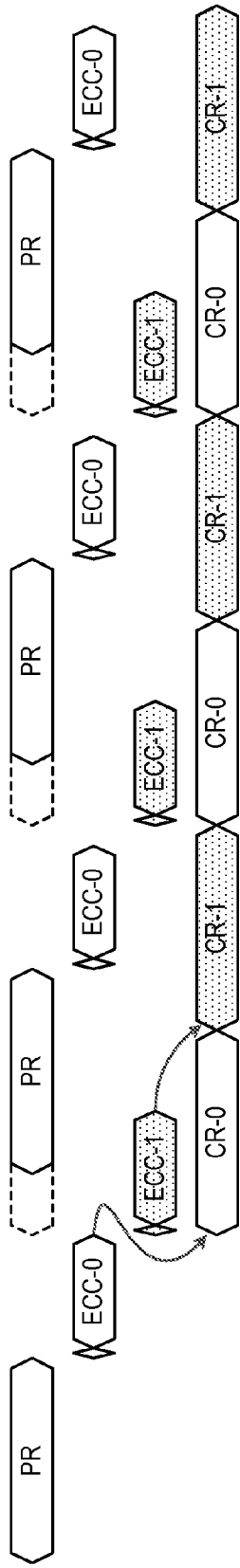
FIG. 8 is a timing waveform diagram of a continuous page read operation with ECC.

FIG. 8 is a timing waveform diagram of a continuous page read operation with ECC. Page read (PR) time and the times for sending data from the first cache register portion to the data bus (CR-0) and for sending data from the second cache register portion to the data bus (CR-1) are each about 20 μs. Assuming an ECC computation time of 12 μs and a DR to CR transfer time of 2 μs, a continuous read operation may be maintained even when the page read operation takes up to 26 μs. The potential increase in the page read time (from 20 us to 26 us) is shown by the addition of the dashed line waveforms. Accordingly, opportunity exists for trading off between ECC computation time and page read time, that is, the page read time may be designed to be shorter if more time is needed for the ECC computation, while the ECC computation time may be designed to be shorter if more time is needed for the page read.

A "continuous read" operation as used herein is different from a typical "sequential read" operation which involves issuing multiple page read cache mode ("PRCM") commands. The page read cache mode command does not support on-chip ECC, and introduces about a 3 μs waiting period in the output data at page boundaries. Advantageously, as used herein, a continuous read supports on-chip ECC and eliminates all such gaps and discontinuities in the output data.

However, if desired for compatibility or other reasons, a type of sequential read operation which supports on-chip ECC using a modified page read cache mode ("PRCM") command may be implemented in accordance with the teachings set forth herein. The modified PRCM command is now described for a two portion page buffer such as the ping-pong page buffer 38 (FIG. 2), although the teachings also apply to a page buffer having more than two portions. In one implementation, the modified PRCM command assumes that one portion of the cache register, for example, CR-0, contains ECC-processed data, while the other portion of the cache register, for example, CR-1, may or may not contain ECC-processed data. The modified PRCM command also assumes that the data register has corresponding portions DR-0 and DR-1, and that at least DR-1 contains valid page data. The modified PRCM command causes data in CR-0 to be output, during which time the data from DR-1 is copied into CR-1 and ECC is then performed on the data in CR-1. While ECC is being performed on the data in CR-1, the next page of data is read from the NAND memory array and stored in DR-0 and DR-1. When the output of data from CR-0 is complete, data then is output from CR-1 with any gap or discontinuity. While data in CR-1 is being output, and after the page read has completed, the data from DR-0 is copied into CR-0 and ECC is then performed on the data in CR-0. ECC on the data in CR-0 completes no later than completion of output from CR-1. At this time, CR-0 contains ECC-processed data and DR-1 contains valid page data, which are the initial conditions for the next modified PRCM command.

Various techniques may be used to initialize the page buffer for the modified PRCM command. Such techniques may also be used with a modified continuous read command, which can be modified to avoid any initial latency by assuming that the entire cache register contains ECC processed data, or as in the case of the modified PRCM command, that CR-0 contains ECC-processed data and DR-1 contains valid page data. Such a modified continuous read command may output data immediately after the user provides the command, address, and optional dummy clocks, without any initial latency. In one illustrative initialization technique, a full initialization command causes a page read into the data register, a transfer of the data from the data register to the cache register, and ECC correction of the entire cache register. The latency introduced by this technique may approach about 60 µs depending on the time required for the ECC processing. In an alternative illustrative technique, a partial initialization command causes a page read into the data register, a transfer of the data from the data register to the cache register, and ECC correction of just one portion of the cache register. The latency introduced by this technique may approach about 40 µs depending on the time required for the ECC processing.

In yet another variation, the cache register and the data register may be organized in more than two portions; for example, in three, four or more portions. The various operations may be carried out in alternation.

The description of the invention including its applications and advantages as set forth herein is illustrative and is not intended to limit the scope of the invention, which is set forth in the claims. Variations and modifications of the embodiments disclosed herein are possible, and practical alternatives to and equivalents of the various elements of the embodiments would be understood to those of ordinary skill in the art upon study of this patent document. Moreover, specific values given herein are illustrative, and may be varied as desired. These and other variations and modifications of the embodiments disclosed herein, including of the alternatives and equivalents of the various elements of the embodiments, may be made without departing from the scope and spirit of the invention, including the invention as set forth in the following claims.

The invention claimed is:

1. A method for outputting a plurality of pages of data from a NAND memory array to a data bus through a data register and a cache register associated with the NAND memory array, comprising:
   storing NAND memory array data in the data register, the data register being organized in a plurality of portions, and the cache register being organized in a plurality of portions corresponding to the portions of the data register;
   outputting data from the cache register portions, seamlessly and in alternation;
   while outputting data from a first one of the cache register portions, providing data to one of the cache register portions other than the first portion from the corresponding portion of the data register and performing an ECC computation thereon; and
   while outputting data from a second one of the cache register portions, providing data to one of the cache register portions other than the second portion from the corresponding portion of the data register and performing an ECC computation thereon.

2. The method of claim 1 further comprising, while outputting data from a third one of the cache register portions, providing data to one of the cache register portions other than the third portion from the corresponding portion of the data register and performing an ECC computation thereon.

3. A method for providing a continuous data output from a NAND memory array to a data bus through a page buffer, the page buffer having a data register and a cache register, comprising:
   storing NAND memory array data in the data register;
   transferring a first portion of data from a first portion of the data register to a first portion of the cache register;
   subsequent to the first data portion transferring step, performing a first ECC computation on data in the first cache register portion;
   subsequent to the first ECC computation performing step, outputting data from the first cache register portion to the data bus;
   transferring a second portion of data from a second portion of the data register to a second portion of the cache register;
   subsequent to the second data portion transferring step, performing a second ECC computation on data in the second cache register portion; and
   subsequent to the second ECC computation performing step, outputting data from the second cache register portion to the data bus;
   wherein the first cache register portion outputting step and the second cache register portion outputting step are performed continuously and in alternation;
   wherein the first ECC computation performing step is performed during the second cache register portion outputting step; and
   wherein the second ECC computation performing step is performed during the first cache register portion outputting step.

4. The method of claim 3 wherein:
   the first data portion transferring step and the first ECC computation performing step are performed during the second cache register portion data outputting step; and the second data portion transferring step and the second ECC computation performing step are performed during the first cache register portion data outputting step.

5. The method of claim 4, further comprising reading a page of data from the NAND memory array to the data register other than during the first data portion transfer step and the second data portion transfer step.

6. The method of claim 4 wherein the first and second cache register portion outputting steps are clocked by user-issued clock cycles in response to a user-issued continuous read command, further comprising continuously outputting data in accordance with the first and second cache register portion outputting steps in every consecutive one of the user-issued clock cycles.

7. The method of claim 6 wherein the continuously outputting data step commences after an initial latency period from the user-issued continuous read command, the initial latency period comprising time to read a page of data from the NAND memory array to the data register and ECC computation time.

8. The method of claim 4 wherein the first cache register portion outputting step and the second cache register portion outputting step are repeated in an interleaved manner.

9. The method of claim 8 wherein
the first and second cache register portion outputting steps are clocked by user-issued clock cycles in response to a user-issued continuous read command, and
further comprising continuously outputting data in an interleaved manner in accordance with the first and second cache register portion outputting steps in every consecutive one of the user-issued clock cycles.

10. The method of claim 9 wherein the continuously outputting data step commences after an initial latency period from the user-issued continuous read command, the initial latency period comprising time to read a page of data from the NAND memory array to the data register and ECC computation time.

11. The method of claim 3, wherein at least one of the first and second ECC computation performing steps comprises overwriting wrong data with corrected data.

12. The method of claim 4, wherein at least one of the first and second ECC computation performing steps comprises overwriting wrong data with corrected data.

13. The method of claim 5, wherein time for the page reading step, the first ECC computation performing step, and the second ECC computation performing step is established to be less than time for the first and second cache register portion outputting steps.

14. A flash memory comprising:
a NAND flash memory array;
a row decoder coupled to the NAND flash memory array;
a data register coupled to the NAND flash memory array;
a cache register coupled to the data register;
an ECC circuit coupled to the cache register;
a column decoder coupled to the cache register;
a control circuit coupled to the row decoder, the column decoder, the data register, the cache register, and the ECC circuit;
wherein the cache register is organized in a plurality of portions, and the data register is organized in a plurality of portions respectively corresponding to the cache register portions; and
wherein the control circuit comprises logic and register elements for executing the functions of:
reading data from the NAND flash memory array to the data register;
transferring data from the data register portions to the respective cache register portions, in alternation;
performing error correction with the ECC circuit on data in the cache register portions in alternation, to provide ECC processed data in the cache register portions; and
outputting the ECC processed data from the cache register portions to the control circuit, seamlessly and in alternation;
wherein execution of the data transferring function and the ECC processed data outputting function for a particular one of the cache register portions is adapted for different times; and
wherein execution of the error correction performing function and the ECC processed data outputting function for a particular one of the cache register portions is adapted for different times.

15. A NAND flash memory comprising:
a NAND flash memory array;
a row decoder coupled to the NAND flash memory array;
a one page data register coupled to the NAND flash memory array;
a page of transmission gates;
a one page cache register coupled to the data register through the transmission gates;
a column decoder coupled to the cache register; and
a control circuit coupled to the row decoder, the column decoder, the data register, the cache register, and the transmission gates, wherein a first group of the transmission gates, and a second group of the transmission gates distinct from the first group, are separately and independently controllable.

16. The NAND flash memory of claim 15 further comprising an ECC circuit coupled to the cache register, the control circuit further being coupled to the ECC circuit.

17. The NAND flash memory of claim 16 wherein essentially half of the page of transmission gates are disposed in the first group, and essentially half of the page of transmission gates are disposed in the second group.

18. The NAND flash memory of claim 17 wherein the control circuit comprises logic and register elements for executing the functions of:
reading data from the NAND flash memory array to the data register;
transferring data from the data register to the cache register in respective first and second portions corresponding to the first and second groups of transmission gates, in alternation;
performing error correction with the ECC circuit on the first and second portions of data in the cache register, in alternation, to provide respective first and second portions of ECC processed data in the cache register; and
outputting the first and second portions of ECC processed data from the cache register to the control circuit, seamlessly and in alternation;
wherein execution of the data transferring function and the error correction performing function for the first portion of data in the cache register are adapted for execution during the ECC processed data outputting function for the second portion of ECC processed data in the cache register; and
wherein execution of the data transferring function and the error correction performing function for the second portion of data in the cache register are adapted for execution during the ECC processed data outputting function for the first portion of ECC processed data in the cache register.

* * * * *